United States Patent [19]

Reynolds

[11] Patent Number: 4,628,283
[45] Date of Patent: Dec. 9, 1986

[54] HERMETICALLY SEALED OSCILLATOR WITH DIELECTRIC RESONATOR TUNED THROUGH DIELECTRIC WINDOW BY ADJUSTING SCREW

[75] Inventor: Allan Reynolds, Flushing, N.Y.
[73] Assignee: The Narda Microwave Corporation, Hauppauge, N.Y.
[21] Appl. No.: 548,924
[22] Filed: Nov. 7, 1983
[51] Int. Cl.$^4$ .................. H03B 5/02; H03B 7/00; H01P 7/10
[52] U.S. Cl. .................. 331/68; 331/96; 331/107 DP; 331/117 D; 331/177 R; 333/219; 333/232
[58] Field of Search .................. 331/68, 96, 107 DP, 331/107 P, 107 SL, 107 C, 117 D, 177 R; 333/219, 232

[56] References Cited

U.S. PATENT DOCUMENTS

| | | | |
|---|---|---|---|
| 3,158,825 | 11/1964 | Vetter | 333/232 |
| 3,390,300 | 6/1968 | Mack | 333/232 X |
| 3,421,122 | 1/1969 | Ito et al. | 333/232 X |
| 3,596,204 | 7/1971 | Vane | 331/107 C X |
| 3,701,049 | 10/1972 | Van Iperen et al. | 331/96 X |

FOREIGN PATENT DOCUMENTS

| | | | |
|---|---|---|---|
| 2336810 | 2/1974 | Fed. Rep. of Germany | 333/232 |
| 2538614 | 3/1976 | Fed. Rep. of Germany | 333/232 |
| 0027293 | 3/1977 | Japan | 331/68 |
| 0033450 | 3/1977 | Japan | 33/250 |
| 0012553 | 1/1979 | Japan | 331/107 SL |
| 0409319 | 8/1974 | U.S.S.R. | 333/232 |

OTHER PUBLICATIONS

H. Nagao et al., "A Millimeter-Wave IMPATT Diode Hermetically Sealed in a Miniature Ceramic Package", *NEC Research & Development* No. 52, Jan. 79, pp. 33–38.
R. Knochel et al., "Temperature Compensation of Cavity Stabilized Gunn Oscillators", *Electronics Letters* vol. 13, No. 24, Nov. 24, 1977, pp. 723–724.
A. Jacob et al., "Broad Band Tunable GaAs-FET Oscillator With Hybrid Coupled Microstrip and Evanescent-Mode Resonators", *Proceedings of the 10th European Microwave Conference Warsaw, Poland,* Sep. 8–12, 1980, pp. 709–713.

*Primary Examiner*—Eugene R. LaRoche
*Assistant Examiner*—D. C. Mis
*Attorney, Agent, or Firm*—Eisenman, Allsopp & Strack

[57] ABSTRACT

Microwave dielectric resonator apparatus which, for example, may be a microwave oscillator frequency stabilized by a dielectric resonator or may be a microwave filter whose critical frequency is determined by a dielectric resonator, has the dielectric resonator environmentally protected in a hermetic chamber. As the hermetic integrity of the chamber would be destroyed by having a tuning slug therein at the end of a screw threaded into a tapped hole through a chamber wall for rotation by a screwdriver outside the chamber, the tuning slug is instead located within a non-hermetic chamber at the end of a screw threaded into a tapped hole through a wall of the non-hermetic chamber serving also as an outer wall of a housing enclosing both chambers. The chambers have an interface which is transparent to microwave fields and proximate the dielectric resonator and tuning slug. The interface preserves the hermetic integrity of the hermetic chamber and transmits part of the microwave field developed by the dielectric resonator, when it resonates, to the non-hermetic chamber to be variously interfered with by the tuning slug as the slug is moved by rotation of the screw into different positional relationships of interference with the transmitted field part. As known per se, such interference alters the distribution and amount of microwave energy stored in the resonating dielectric resonator, and thereby alters the microwave frequency at which the dielectric resonator resonates. By using a puck of barium titanate as the dielectric resonator, a resonant frequency of 12 gigahertz is typically obtainable with a range of stable adjustment thereabout in the vicinity of 20 megahertz.

35 Claims, 5 Drawing Figures

HERMETICALLY SEALED OSCILLATOR WITH DIELECTRIC RESONATOR TUNED THROUGH DIELECTRIC WINDOW BY ADJUSTING SCREW

BACKGROUND OF THE INVENTION

This invention relates to microwave dielectric resonator apparatus and, more particularly, to such apparatus as oscillators that are stabilized in output frequency by a dielectric resonator.

Heretofore, dielectrically stabilized microwave oscillators have been provided in which a dielectric resonator puck stores microwave energy coupled thereto by a driving circuit. This causes the puck to resonate at a microwave frequency to which the output frequency of the oscillator becomes stabilized.

It is conventional to make such known oscillators mechanically tunable to compensate for frequency drift due to aging. In that case, the dielectric resonator is generally associated with a tuning slug movable into and out of positions at which it variously interferes with external field lines of the puck which correspond to a portion of the stored microwave energy in the puck, thereby to alter the microwave resonant frequency of the puck to which the oscillator output frequency becomes stabilized. To this end, the tuning slug, the dielectric resonator puck and the driving circuit have all been enclosed in a non-hermetic housing. Typically, the tuning slug has been disposed directly over the puck at one end of a shaft threaded into an overlying wall of the housing, the other end of the shaft lying outside the housing and being slotted to receive a screwdriver by which an operator mechanically positions the slug toward and away from the top of the puck.

While the known mechanical tuning arrangement is satisfactory in dielectrically stabilized microwave oscillators where, for example, active or negative resistance elements of the puck driving circuits are individually encapsulated for environmental protection, such as Gunn diodes, it is inherently unsatisfactory in dielectrically stabilized microwave oscillators having puck driving circuits which employ active elements which are not individually encapsulated, notably GaAsFETs, and which must be hermetically housed for environmental protection. Such driving circuits may even include buffer amplifier stages and other circuitry having exposed semiconductor devices which, independently of whether the active elements individually are encapsulated or unencapsulated, require hermetic protection from the environment.

The reason why the known mechanical tuning arrangement is inherently unsatisfactory where hermetic protection from the environment is required is simply that the known arrangement renders it virtually impossible to preserve the required hermetic protection for any considerable length of time due to contaminating leakage at the threaded shaft of the tuning slug. While a mechanical positioning of the tuning slug with a bellows arrangement would overcome the leakage problem, it would introduce intolerable mechanical hysteresis and be intolerably microphonic. Thus, up to now, mechanical tuning of hermetically sealed dielectrically stabilized microwave oscillators has not been feasible, and electronic tuning, such as by Varactors, has been the only practical way to achieve tuning access into a hermetically sealed enclosure.

SUMMARY OF THE INVENTION

An object of the invention is to provide improved means for rendering the dielectric resonator of a microwave dielectric resonator apparatus mechanically tunable about its resonant frequency from without a hermetic chamber in which the resonator is disposed.

Another object of the invention is to provide a microwave dielectric resonator apparatus with an improved arrangement for mechanically and selectively altering the resonant frequency of the resonator without penetrating a hermetic chamber enclosing the resonator.

Another object of the invention is to provide an improved microwave dielectric apparatus of the kind in which a dielectric resonator puck stores microwave energy coupled thereto by a driving circuit and in which both the puck and the driving circuit are disposed in a hermetically sealed enclosure.

Another object of the invention is to provide an improved dielectrically stabilized microwave oscillator of the kind in which the oscillator output frequency becomes stabilized to the microwave resonant frequency of a dielectric resonator enclosed in a hermetic chamber together with a driving circuit for the resonator.

Another object of the invention is to provide an improved mechanically tuned microwave oscillator stabilized in output frequency by a dielectric resonator.

According to one aspect of the invention, a dielectric resonator puck and a driving circuit for causing the puck to resonate at a microwave frequency are housed in a hermetically sealed chamber, externally of which a movable tuning slug is mounted together with cooperating means for mechanically positioning the slug, the chamber being impervious to microwave fields except at a local wall area thereof which transmits out of the chamber at least a portion of the field lines developed around the puck when the puck is driven into resonance, the transmitted portion being in a path permitting this portion to be interfered with by the tuning slug for altering the microwave resonance frequency of the puck.

According to another aspect of the invention, there is provided a method of obtaining a fine tuning adjustment of the resonant frequency of a dielectric microwave resonator from a location outside of a hermetically sealed chamber which encloses the resonator in common with microwave circuitry energizable to develop fringing fields at microwave frequencies that link with the resonator to excite it into a state of resonance. The method is carried out by forming the hermetically sealed chamber with a bounding structure which has the property of confining microwave fields within the chamber except at a window portion thereof transparent to such fields; positioning the dielectric microwave resonator relative to the window portion so that part of the field developed about the resonator by the fields circulating therein during its state of resonance passes through the window portion; movably disposing outside the hermetically sealed chamber proximate the window portion a slug of solid material capable of influencing the field part as a function of the positional relationship of the slug with the field part and of thereby altering the distribution and amount of the energy associated with the resonator current and stored in the field about the resonator, any such alternation being effective to alter the resonant frequency of the resonator; and adjusting the position of the slug relative to the field part so as to obtain the fine tuning adjustment of the resonant frequency of the resonator.

BRIEF DESCRIPTION OF THE DRAWINGS

The aforesaid and further objects, advantages and aspects of the invention will be more clearly understood from the ensuing detailed description when read in conjunction with the appended drawings, in which.

DETAILED DESCRIPTION OF THE INVENTION

Figure 1:
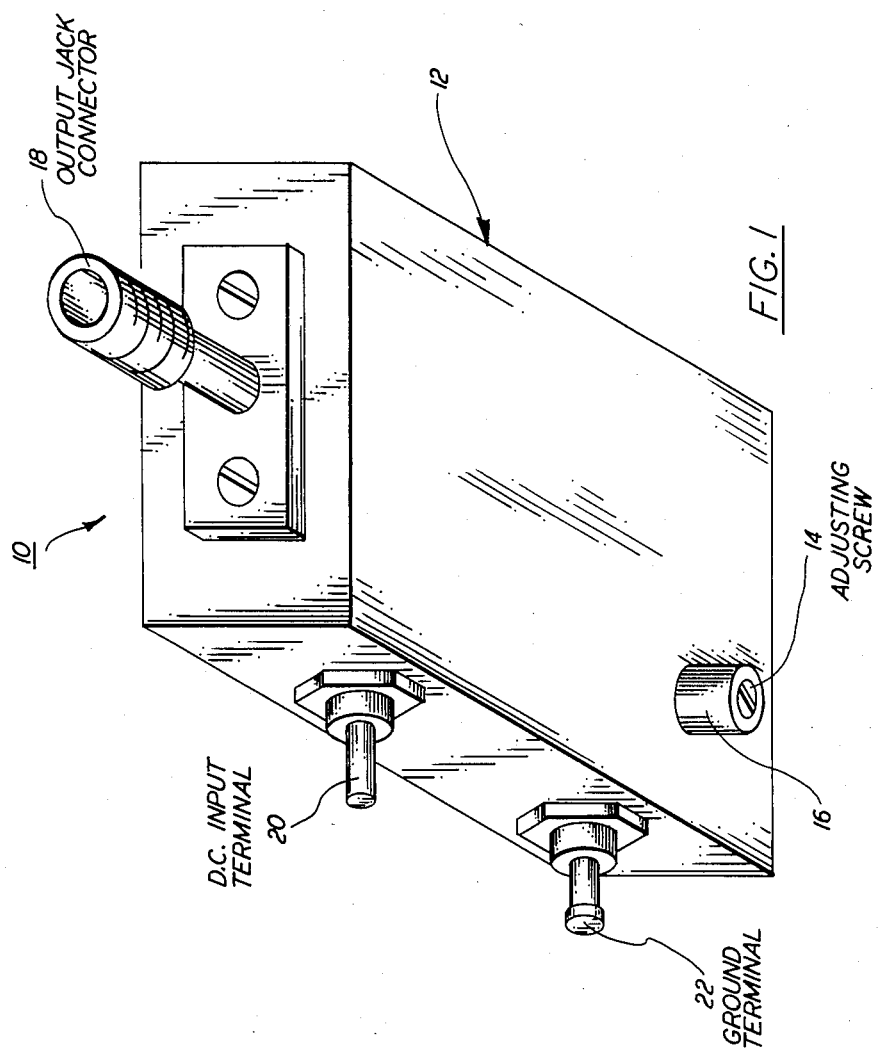
FIG. 1 is an isometric exterior view of a microwave dielectric resonator oscillator.
Figure 2:
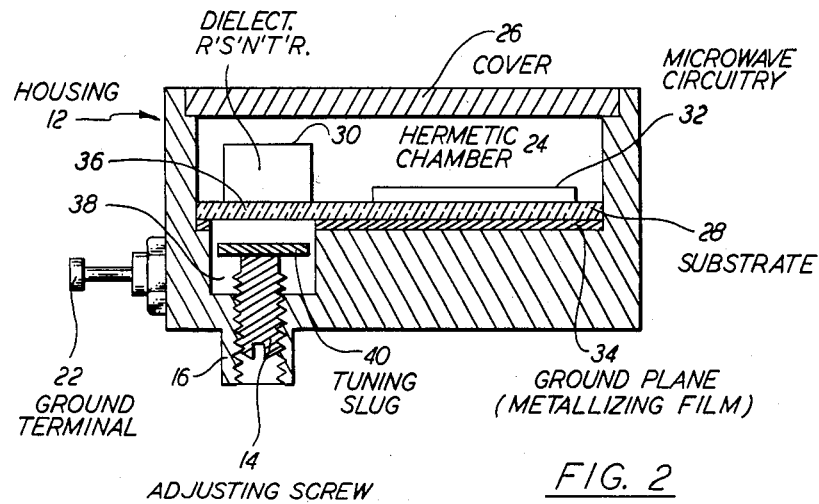
FIGS. 2 and 5 are elevational views, partly in section, showing alternative interior structures for the oscillator exteriorly depicted in FIG. 1.
Figure 5:
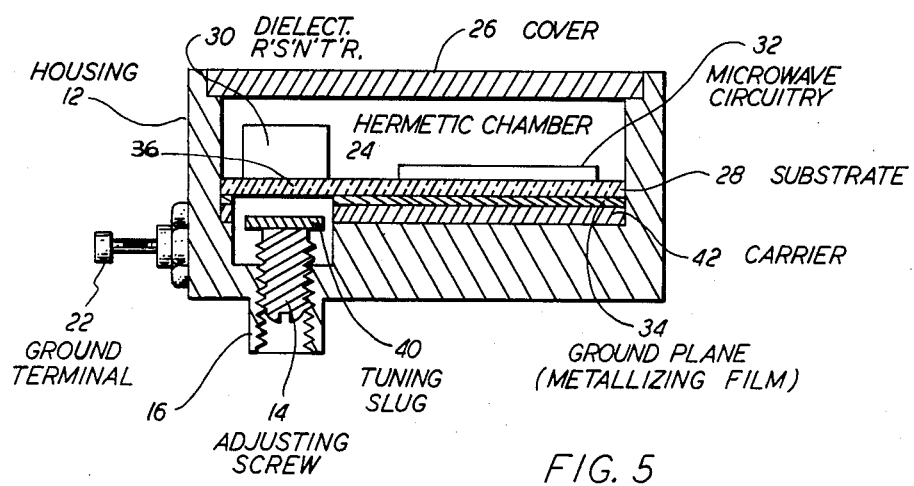

In FIGS. 1, 2 and 5, the invention is illustrated as embodied in a microwave dielectric resonator oscillator 10 having a rectangular box-like housing 12 formed of a non-loss metal such as aluminum which confines the microwave fields.

Referring particularly to FIG. 1, an adjusting screw 14 for use with a screwdriver in mechanically tuning oscillator 10 is threaded within a small cylindrical sleeve 16 perpendicularly projecting from the bottom of housing 12. The back of housing 12 carries an output jack connector 18 adapted for connection to a female fitting of a coaxial cable in order to couple the oscillator output from a hermetic feed-through terminal (not shown) to the coaxial cable in a conventional manner. On the left side of housing 12, a d.c. input terminal 20 and a ground terminal 22 are mounted as hermetic feed-through terminals for respectively providing oscillator 10 with d.c. bias and reference potentials necessary for its operation.

With reference to the showing in FIG. 2 of one interior structure of oscillator 10, housing 12 includes a hermetically sealed chamber 24 bounded at the top by a cover 26 which also serves as the top of housing 12. The bottom of hermetic chamber 24 is provided by a substrate 28 of a suitable dielectric material transmissive to microwave fields and capable of forming a hermetic seal, such as alumina or quartz, parallel to cover 26. The bounds of hermetic chamber 24 are completed by side portions of housing 12 to which the peripheries of cover 26 and substrate 28 are eventually soldered or brazed to provide chamber 24 with its hermetic integrity.

Substrate 28 supports on its upper surface a dielectric resonator puck 30 and microwave driving circuitry 32 along the puck and has on its opposite surface a metalizing film constituting a ground plane 34. A portion of the lower surface of substrate 28 underlies puck 30 and, being free of the metallizing film, provides substrates 28 with an r-f window 36 therethrough for microwave field lines developed around the resonating puck 30. A cup-shaped non-hermetic chamber 38 is formed in housing 12 directly beneath window 36 for receiving the microwave field lines; and a circular metallic tuning slug 40 mounted at the inner end of adjusting screw 14 is disposed in non-hermetic chamber 38 to be selectively movable into different interfering relationships with the window transmitted field lines by mechanically turning the screw 14 in the internal threads of sleeve 16 and a continuation thereof in a housing hole extending the sleeve interior into non-hermetic chamber 38.

Resonator puck 30 is a precision ground cylinder of a suitable dielectric material, such as barium titanate, purified to an extremely high degree and having a dielectric constant in the range of said from 30 to 42. Microwave driving circuitry 32 includes etched microstrip elements integrated with one or more negative resistance active elements, such as gallium arsenide field effect transistors (GaAsFETs), and is energized by applying a d.c. bias voltage thereto by way of hermetic feed-through terminal 20 (FIG. 1). The intercoupling association of such microwave driving circuitry, by way of the fringing fields it develops when energized, with such a dielectric resonator puck to form a dielectrically stabilized microwave oscillator is well-known. Equally known is the resultant functioning of the puck as a resonant circuit which determines the oscillator output frequency and in and around which a microwave field is created by the fields circulating in the resonating puck, the output of the driving circuitry 32 feeding microwave energy to the puck to induce natural resonance which in turn feeds the input of the driving circuitry to stabilize the oscillator frequency. In fact, such fields represent the energy stored in the puck and the microwave field is a manifestation of that stored energy. According to the invention, part of that field passes through window 36 to be influenced by the tuning slug 40 as a function of the positional relationship of the slug with the field part. Thus, the distribution and amount of the energy associated with the puck current and stored in the field about puck 30 is altered, thereby effectively altering the resonant frequency of the puck without placing the mechanically movable tuning slug 40 in the hermetic chamber 24 enclosing the puck and its microwave driving circuitry 32.

Referring now to FIG. 5, wherein like parts are identified by like reference numerals, the alternative interior structure for oscillator 10 (FIG. 1) is distinguished from the structure shown in FIG. 2 by the addition of a Kovar carrier 42 upon which electrical ground plane 34 uniformly rests and which has a cut-out coextensive with the window 36 of substrate 28. Kovar carrier 42 facilitates the assembling of the apparatus, and lowers the thermally induced mechanical stress between the housing and the substrate.

Figure 3:
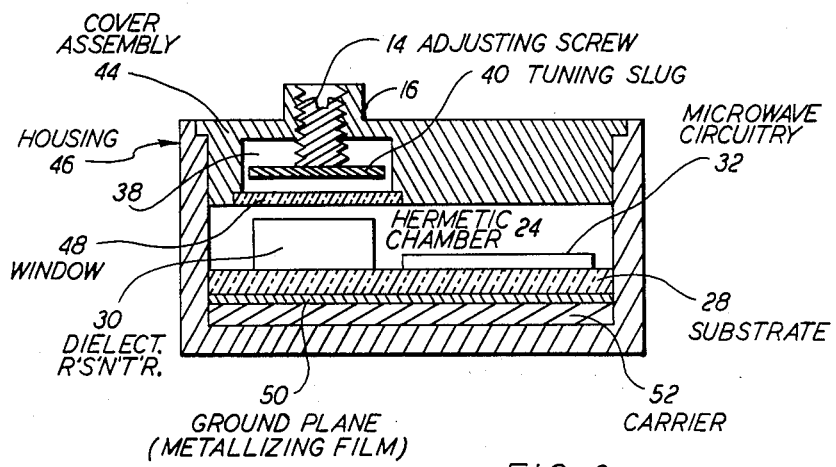
FIGS. 3 and 4 are elevational views, partly in section, illustrating modifications of the interior structures shown in FIGS. 2 and 5.

The variant shown in FIG. 3, wherein like parts are again identified by like reference numerals, permits the screwdriver positional adjustments of tuning slug 40 to be made proximate the unsupported upper side of dielectric resonator puck 30, i.e. at a non-hermetic location directly overlying the puck. To this end, cup-shaped non-hermetic chamber 38 is now formed in a cover assembly 44 of a modified housing 46; and a quartz or alumina window 48, transparent to microwave fields, hermetically seals the mouth of cup-shaped chamber 38 at its interface with hermetic chamber 24. Magnetic field lines about puck 30 accordingly pass upwardly through window 48 to be interfered with by tuning slug 40. Thus, the under surface of puck-supporting substrate 28 is now entirely metallized with a chrome-gold film to provide an uninterrupted electrical ground plane 50 for circuitry 32; and a Kovar carrier 52 sandwiched between the electrical ground plane and the bottom of housing 46 omits the circular cut-out required in carrier 42 of FIG. 5.

Figure 4:
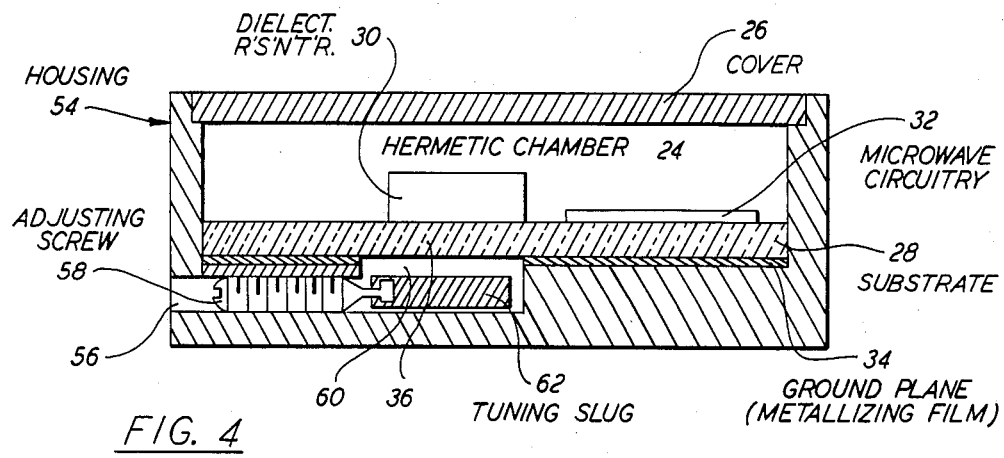

Reference is now made to the variant illustrated in FIG. 4, wherein like parts are once again identified by like reference numerals. Here, a movable tuning slug 52 is slid in a direction substantially parallel to the base of dielectric resonator puck 30 in order to achieve its different positional states of interference with the microwave field developed in and around puck 30. To this end, a modified housing 54 has a base provided with a tapped horizontal hole 56 in which an adjusting screw 58 is threadedly engaged and which opens into a non-hermetic chamber 60 directly underlying window 36. A rod-shaped metallic tuning slug 62 of diameter less than that of hole 56 is loosely connected to the inner end of adjusting screw 58 and rests on the floor of non-hermetic chamber 60 so that it will be slidably positioned into and out of non-hermetic chamber 60 in response to mechanical tuning of adjusting screw 58 by a screwdriver. Accordingly, the influence of tuning slug 62 on the part of the puck's surrounding microwave field transmitted out of hermetic chamber 24 through window 36 is a function of the positional relationship of the slug with that field part, as determined by the slug's sliding movements.

While the invention has been particularly shown and described with reference to microwave dielectric resonator oscillator embodiment thereof, it will be understood by those skilled in the art that the invention may be embodied in other microwave dielectric resonator apparatus. For example, the invention may be embodied in a mechanically tunable microwave filter which employs a hermetically protected dielectric resonator puck determinative of the critical frequency of the filter. It will moreover be understood by those skilled in the art that various alterations in form and detail may be made in each of the embodiments of the invention shown and described herein. For example, the construction of cover assembly 44 (FIG. 3) may be simplified by removing ceramic window (alumina, quartz, etc.) 48 and the fixed metal supporting portion thereof up to the supporting shoulder at the top of housing 46 and, by way of substitution, hermetically attaching the mouth of a ceramic cup to the underside of the remaining plate-like fixed metal portion so that the cup encloses tuning slug 40 with the bottom of the cup being disposed over the top of dielectric resonator puck 30.

I claim:

1. In a microwave resonator apparatus of the class comprising a dielectric resonator puck having a microwave natural frequency, a driving circuit for exciting the puck to resonate at its natural frequency and develop a microwave field thereabout, and a mechanically movable tuning member arranged to be moved selectively into different positions of interference with a portion of said microwave field, thereby to cause the frequency at which the puck resonates when excited by said driving circuit to deviate from said natural frequency as a function of the tuning member's interference with said microwave field portion, the improvement wherein:

the dielectric resonator puck and the driving circuit are jointly housed within a hermetically sealed chamber from which the mechanically movable tuning member is excluded in order to maintain the hermetic integrity of said chamber;

the hermetically sealed chamber is bounded by material which is substantially opaque to microwave fields and which, in a manner consonant with said hermetic integrity of said chamber, is provided with microwave field transparency in a region thereof proximate the dielectric resonator puck in order to transmit out of said chamber said portion of the microwave field developed about said puck; and the mechanically movable tuning member is located in relation to said region of field transparency and the transmission path therethrough of said portion of the microwave field developed about the dielectric resonator puck so as to effect said deviation from said natural frequency by the selective movement of said tuning member into said different positions of interference with said microwave field portion.

2. Apparatus according to claim 1, wherein said hermetically sealed chamber is provided in a housing which encloses a non-hermetic chamber containing said mechanically movable tuning member and interfacing with said hermetically sealed chamber at said region of microwave field transparency.

3. Apparatus according to claim 2, wherein said dielectric resonator puck and said driving circuit are supported alongside one another on the upper surface of a flat dielectric substrate disposed in said housing, the lower surface of said substrate being coated with a metal film for providing an electrical ground plane for said driving circuit.

4. Apparatus according to claim 3, wherein the coated substrate defines a portion of the bounds of said hermetically sealed chamber.

5. Apparatus according to claim 4, wherein said non-hermetic chamber underlies said coated substrate, and wherein said region of microwave field transparency is defined by a minor area of the coated substrate whereat said metal film is omitted.

6. Apparatus according to claim 3, wherein said non-hermetic chamber overlies said dielectric resonator puck.

7. Apparatus according to claim 6, wherein the bounding structure of said non-hermetic chamber includes a dielectric end wall which provides said hermetically sealed chamber with its said region of microwave field transparency and said non-hermetic chamber with its said interfacing thereat.

8. Apparatus according to claim 7, wherein said dielectric end wall is a quartz plate hermetically connected around its periphery to a metal side wall portion of said bounding structure of said non-hermetic chamber.

9. Apparatus according to claim 7, wherein the other end wall of said bounding structure of said non-hermetic chamber constitutes a portion of the top of said housing and is provided with a tapped hole therethrough in which an adjusting screw for mechanically moving said tuning member is threadedly engaged.

10. In a microwave resonator apparatus having a dielectric resonator puck for storing microwave energy which is coupled to the puck by a driving circuit and which causes the puck to resonate at a microwave frequency, said puck being associated with a tuning member movable by cooperating mechanical positioning means into and out of positions at which it variously interferes with external field lines of the puck which correspond to a portion of the microwave energy stored in said puck, thereby to alter the microwave resonant frequency of said puck, the improvement wherein said microwave resonator apparatus is provided with a hermetically sealed chamber internally of which said dielectric puck and driving circuit are housed for environmental protection and externally of which said movable tuning member is mounted together with said cooperating mechanical positioning means thereof, said chamber being substantially opaque to microwave fields except at a local wall area thereof which transmits at least a portion of said external field lines of said puck out of said chamber in a path permitting said portion to be interfered with by said tuning member, whereby alterations of the microwave resonant frequency of the dielectric resonator puck caused by positioning the movable tuning member can be made notwithstanding the location of said tuning member outside the hermetically sealed chamber in which said puck is housed.

11. In a microwave dielectric resonator apparatus of the class comprising a housing containing a negative resistance circuit a dielectric resonator puck for coupling microwave energy from said negative resistance circuit back into the circuit in response to an application of a d.c. voltage to said circuit, said a tuning member mechanically adjustable into different positional states of interference with the microwave field developed around said resonator puck by current circulating therein representative of the microwave energy stored in said resonator puck, thereby to cause respective changes in the resonant frequency of said resonator puck, the improvement wherein:
said housing is internally provided with a hermetic chamber in which said dielectric resonator puck and negative resistance circuit are disposed for environmental protection and from which said mechanically adjustable tuning member is excluded for preserving the hermetic integrity of said chamber; and wherein, in order that said different positional states of interference with said microwave field may be achieved by said mechanically adjustable tuning member notwithstanding its exclusion from said hermetic chamber, a non-hermetic housing region, in which said housing contains said tuning member, interfaces with said hermetic chamber at interface means which are proximate said resonator puck and tuning member, are consonant with the preservation of said hermetic integrity and are transparent to said microwave field.

12. Apparatus according to claim 11, wherein said hermetic chamber is defined by sidewall portions of said housing, a cover component of said housing and a dielectric substrate in spaced parallel relationship with said cover component, said substrate carrying said resonator puck and negative resistance circuit on the substrate surface facing said cover component and carrying a metal coating on at least part of the substrate surface facing away from said cover component, said metal coating serving as an electrical ground plane for said negative resistance circuit.

13. Apparatus according to claim 12, wherein said interface means is a portion of said substrate which directly underlies said puck and whereat said substrate surface facing away from said cover component is free of said metal coating.

14. Apparatus according to claim 12, wherein said non-hermetic region of said housing overlies said resonator puck and is bounded at the top by a portion of said cover component and at the bottom by said interface means.

15. Apparatus according to claim 14, wherein said non-hermetic region comprises an open-mouthed chamber extending upwardly within said cover component from the bottom thereof, in combination with a low-pass ceramic plate that seals the mouth of said chamber and serves as said interface means.

16. In a mechanically tunable microwave oscillator comprising a dielectric microwave resonator puck whose natural frequency determines the oscillator output frequency, a driving circuit for causing the puck to resonate at said natural frequency, and a mechanically movable tuning slug for interfering with the microwave field developed in and around the resonating puck, thereby causing the puck to resonate at a microwave frequency which varies from said natural frequency in accordance with variations in the interference of said slug with said microwave field, the improvement wherein:
said mechanically movable tuning slug is mounted outside a hermetically sealed enclosure containing said puck and driving circuit; and
interfering access by said tuning slug outside said enclosure to the microwave field developed in and around said puck inside said enclosure is obtained by means of an r-f window forming part of the bounds of the enclosure and being arranged to transmit part of said microwave field in a path permitting said slug to interfere with said microwave field to vary said such resonant microwave frequency.

17. A microwave oscillator in which a dielectric resonator puck stores microwave energy coupled thereto by a driving circuit which causes said puck to resonate at a microwave frequency to which the output frequency of the oscillator becomes stabilized, said puck being associated with a tuning slug movable into and out of positions at which it variously interferes with external field lines of the puck which correspond to a portion of the microwave energy stored in said puck, thereby to alter the microwave resonant frequency of said puck to which said oscillator output frequency becomes stabilized, wherein the improvement comprises a hermetically sealed chamber internally of which said dielectric puck and driving circuit are housed for environmental protection and externally of which said movable tuning slug is mounted together with cooperating means for mechanically positioning said slug, said chamber being impervious to microwave fields except at a local r-f transparent window thereof which transmits at least a portion of said external field lines of said puck out of said chamber in a path permitting said portion to be interfered with by said tuning slug, whereby mechanical tuning of said oscillator by positioning said movable tuning slug is made possible notwithstanding the location of said movable tuning slug outside the hermetically sealed chamber containing the dielectric resonator puck and driving circuit of said oscillator.

18. A stable tunable microwave oscillator apparatus comprising:
(a) a hermetically sealed enclosure confining microwave fields except where a microwave transparent window in a minor portion thereof is provided;
(b) a microwave oscillator disposed within said enclosure, said oscillator comprising a microwave resonator puck of dielectric material and a solid state driving circuit coupled in driving relation to the puck, said puck being arranged to respond to the output of said driving circuit and to couple energy back to said driving circuit to cause said oscillator to oscillate at the microwave natural frequency of said resonator puck following an application of a d.c. bias to said circuit, said resonator puck being proximate to said window portion so that part of the microwave field created around the puck during oscillation of said oscillator leaves said hermetically sealed enclosure via said window portion; and (c) a tuning slug adjustably mounted for positioning externally of said enclosure so as selectively to intercept and couple with said leaving microwave field part, thereby to cause said resonator puck to resonate above or below its microwave natural frequency, depending on the selected adjusted position of said slug relative to said field part.

19. Apparatus according to claim 18, wherein said solid state driving circuit includes a plurality of circuit elements, some of which are not environmentally protected by encapsulation and at least one of which is an active element having a negative resistance characteristic.

20. Apparatus according to claim 19, wherein said active element is selected from the group consisting of a Gunn diode, a GaAsFET and a bipolar transistor.

21. Apparatus according to claim 18, wherein said window portion is provided in one of several walls defining said enclosure, said one wall comprising a flat substrate having an etched metallic coating on its interior surface forming part of said driving circuit and having another metallic coating on its exterior surface forming an electrical ground plane for said driving circuit.

22. Apparatus according to claim 21, wherein said substrate is pervious to microwave fields and wherein said window portion is defined by opposed exterior and interior surface areas of said substrate which are devoid of said metallic coatings in portion thereof.

23. Apparatus according to claim 21, wherein said substrate is impervious to microwave fields and wherein said window portion is defined by a microwave field transmissive member which hermetically seals an opening passing perpendicularly through said substrate and its metallic surface coatings.

24. Apparatus according to claim 22, wherein said resonator puck is supported on said substrate in a position overlying said window portion.

25. Apparatus according to claim 18, wherein said window portion is defined by a microwave field transmissive member which hermetically seals an opening passing perpendicularly through a first wall of said enclosure, and wherein said puck is supported on a second wall of said enclosure opposite said first wall in a position substantially aligned with said window portion.

26. A hermetically sealed mechanically tunable microwave dielectric resonant apparatus in which the precise frequency of resonance is controlled by a solid dielectric resonator excited by an associated microwave circuit, said apparatus comprising:
a substrate carrying the solid dielectric resonator and the associated microwave circuit;
a rigid hermetically sealed housing enclosing the solid dielectric resonator and the associated microwave circuit;
an electrically conducting film forming a ground plane beneath the substrate;
a microwave field window in the hermetically sealed housing in close proximity to the solid dielectric resonator;
a metallic tuning slug movably supported adjacent said window outside of the hermetically sealed housing; and
mechanical adjustment means to shift the position of the tuning slug to alter the microwave field in the solid dielectric resonator to change the natural microwave frequency thereof.

27. A method of obtaining a fine tuning adjustment of the resonant frequency of a dielectric microwave resonator from a location outside of a hermetically sealed chamber which encloses the resonator in common with microwave circuitry energizable to develop fringing fields at microwave frequencies that link with said resonator to excite it into a state of resonance, said method comprising the steps of:
(a) forming the hermetically sealed chamber with a bounding structure which has the property of confining microwave fields within said chamber except at a window portion thereof transparent to such fields;
(b) positioning the dielectric microwave resonator relative to said window portion so that part of the field developed about said resonator by the current circulating therein during said state of resonance passes through said window portion;
(c) movably disposing outside said hermetically sealed chamber proximate said window portion a slug of solid material capable of influencing said field part as a function of the positional relationship of said slug with said field part and of thereby altering the distribution and amount of the energy associated with said resonator current and stored in said field about said resonator, any such alteration being effective to alter the resonant frequency of said resonator; and
(d) adjusting the position of said slug relative to said field part so as to obtain said fine tuning adjustment of the resonant frequency of said resonator.

28. A method according to claim 27, which comprises using, as a component of said chamber bounding structure, a flat substrate of dielectric material having a metal film on its outer surface partially etched away to provide said window portion, and disposing said resonator on the inner surface of said substrate in a position overlying said window portion.

29. A method according to claim 28, which comprises disposing said microwave circuitry on said inner surface of said substrate in a position alongside said resonator, and using said metal film as an electrical ground plane for said microwave circuitry.

30. A method according to claim 27, which comprises disposing said resonator in a position underlying said window portion and disposing said slug in a position overlying said window portion, so that field lines emanating from the top of said resonator pass through said window portion to be influenced by said slug.

31. A method according to claim 27, which comprises moving said slug in a direction substantially perpendicular to said window portion in order to obtain said influencing of said field part as a function of said positional relationship of said slug with said field part.

32. A method according to claim 27, which comprises moving said slug in a direction substantially parallel to said window portion in order to obtain said influencing of said field part as a function of said positional relationship of said slug with said field part.

33. A method according to claim 27, which comprises using a solid disc of barium titanate as said dielectric microwave resonator.

34. A method according to claim 27, which comprises causing the movement of said slug to take place in a non-hermetic region of a housing containing said hermetically sealed chamber, and effecting the positional adjustment of said slug by rotating a screw which is attached to said slug and which is threaded in the housing and accessible for rotation from outside said housing.

35. A method of mechanically adjusting the frequency at which a dielectric microwave resonator disposed in a hermetically sealed enclosure resonates when excited by a microwave circuit disposed in the same enclosure, the excitation of said resonator producing a microwave field around the resonator representing a portion of the energy stored in the resonator by said microwave circuit, said method comprising the steps of:
 (a) passing part of said microwave field out of said enclosure without disturbing the hermetically sealed condition of said enclosure; and
 (b) intercepting said microwave field part with a mechanically positionable member to alter the distribution and amount of stored energy in said resonator, thereby to effect said adjustment of the frequency at which said resonator resonates.

* * * * *